(12) United States Patent
Rausch et al.

(10) Patent No.: US 6,930,030 B2
(45) Date of Patent: Aug. 16, 2005

(54) METHOD OF FORMING AN ELECTRONIC DEVICE ON A RECESS IN THE SURFACE OF A THIN FILM OF SILICON ETCHED TO A PRECISE THICKNESS

(75) Inventors: Werner A. Rausch, Stormville, NY (US); Tina J. Wagner, Newburgh, NY (US); Sadanand V. Deshpande, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/453,080

(22) Filed: Jun. 3, 2003

(65) Prior Publication Data

US 2004/0248348 A1 Dec. 9, 2004

(51) Int. Cl.$^7$ .................... H01L 21/3205; H01L 21/302
(52) U.S. Cl. ...................... 438/589; 438/705
(58) Field of Search ................ 438/705, 766, 438/924, 149–155, 183, 589

(56) References Cited

U.S. PATENT DOCUMENTS

| 4,925,805 | A | * | 5/1990 | van Ommen et al. | 438/407 |
|---|---|---|---|---|---|
| 5,391,912 | A | * | 2/1995 | Horiuchi et al. | 257/588 |
| 5,436,174 | A | * | 7/1995 | Baliga et al. | 438/705 |
| 5,641,380 | A | * | 6/1997 | Yamazaki et al. | 438/304 |
| 6,021,215 | A | * | 2/2000 | Kornblit et al. | 382/141 |
| 6,258,727 | B1 | * | 7/2001 | Maccagnan | 438/714 |
| 6,261,924 | B1 | | 7/2001 | Mandelman et al. | 438/430 |
| 6,303,508 | B1 | * | 10/2001 | Alok | 438/705 |
| 6,403,433 | B1 | | 6/2002 | Yu et al. | 438/300 |
| 6,420,218 | B1 | | 7/2002 | Yu | 438/299 |
| 6,429,055 | B2 | | 8/2002 | Oh | 439/149 |
| 6,440,828 | B1 | * | 8/2002 | Sato et al. | 438/533 |
| 6,492,696 | B2 | | 12/2002 | Morimoto et al. | 257/412 |
| 2002/0130325 | A1 | * | 9/2002 | Alok | 257/77 |
| 2002/0160568 | A1 | | 10/2002 | Durcan et al. | 438/246 |
| 2003/0040154 | A1 | | 2/2003 | Durcan et al. | 438/246 |

\* cited by examiner

*Primary Examiner*—Olik Chaudhuri
*Assistant Examiner*—Lex H. Malsawma
(74) *Attorney, Agent, or Firm*—Graham S. Jones, II; H. Daniel Schnurmann

(57) ABSTRACT

A method for precise thinning to form a recess to a precise depth in a crystalline silicon layer, which can be used to form various devices, such as MOSFET devices, includes the following steps. Form a patterning mask with a window therethrough over the top surface of the silicon layer. Form an amorphized region in the top surface of the silicon layer below the window. Selectively etch away the amorphized region of the silicon layer to form a recess in the surface of the silicon layer, and remove the patterning mask. In the case of an MOSFET device form a hard mask below the patterning mask with the window extending therethrough. Then create sidewall spacers in the window through the hard mask and form a gate electrode stack in the window. Then remove the hard mask and form the source/drain extensions, halos and regions plus silicide and complete the MOSFET device.

20 Claims, 6 Drawing Sheets

METHOD OF FORMING AN ELECTRONIC DEVICE ON A RECESS IN THE SURFACE OF A THIN FILM OF SILICON ETCHED TO A PRECISE THICKNESS

BACKGROUND OF THE INVENTION

This invention relates to methods of forming thinner silicon structures with precisely defined thicknesses in a thin silicon substrate, and more particularly to subtractive methods of precisely thinning selected portions of a silicon structure to form recesses with various precise depths in the surface of the thin silicon substrate into which recesses various devices including MOSFETS, resistors, capacitors and diodes can be formed.

This invention provides a method for forming a structure with a precision recessed gate structure for an Ultra Thin (UT) Silicon-On-Insulator (SOI) device comprising a thin layer of doped silicon formed on the surface of a Buried OXide (BOX) layer. The method can also be used for precision thinning of selected regions of the top silicon layer on a SOI (SOI) wafer. This can be used to provide an optimal silicon thickness for each type of electronic device which is to be formed on the same wafer. For example, MOSFETS require thinner silicon than resistors or capacitors or diodes in order to achieve the best electrical characteristics.

Scaling of SOI devices can be limited by the ability to thin the silicon. The silicon thickness must be thinned to achieve device performance targets, but simultaneously the silicide used to contact the source/drain region must be prevented from consuming the entire thickness of the silicon and as a result contacting the BOX layer. This is a significant problem because source/drain contact resistance increases very rapid as the silicide layer approaches the BOX layer.

FIGS. 1A and 1B illustrates a possible approach to forming a raised source/drain structure that employs the option of forming raised source regions and drain regions (above the SOI structure) juxtaposed with the gate electrode stack of the MOSFET device by deposition of additional silicon adjacent to the gate electrode stack after formation thereof.

In FIG. 1A, a MOSFET device 10 is shown in an intermediate stage of manufacture. The substrate 12 comprises a BOX layer upon which a thin doped silicon layer 14 has been formed to serve as the doped region in which the source/drain and channel of an FET device are to be formed. Above the center of the silicon layer 14, a gate electrode stack comprising a gate oxide layer GOX, a polysilicon gate G and a silicide layer SCD have been patterned followed by formation of sidewall spacers on the sidewalls of the gate electrode stack ST.

FIG. 1B shows the device 10 after the exposed surfaces of the thin silicon layer aside from the spacers SP has been coated with a thin epitaxial silicon layer 16 to form what will later be employed as raised source/drain regions by additional processing steps as will be well understood by those skilled in the art.

The method of FIGS. 1A and 1B has significant issues with the selective epitaxy necessary to form the raised source drain. In the selective epitaxy process, silicon is deposited selectively only on exposed silicon surfaces and not on dielectric surfaces such as silicon dioxide isolation regions and silicon nitride spacers. This process is difficult to control because it relies on the balance between silicon deposition and etching in a chemical vapor deposition reactor. Even when acceptable deposition rates on silicon are achieved while simultaneously getting no significant deposition on the dielectric surfaces, the shapes of corners and edges of the silicon surfaces can be changed because of variations in the silicon growth/etch rates with crystallographic orientation. This leads to faceting of these edges resulting in unacceptable device structures. The process is also very sensitive to surface contamination and prior processing conditions during such commonly used process steps as ion implantation, reactive ion etching and wet chemical cleans and etches. The deposition rates are also affected by dopant species and concentration in the silicon surface layers. This can lead to different deposition thicknesses on nFETs and pFETs which is generally undesirable.

Another option is recessing the gate. Such an approach is described by Morimoto et al. U.S. Pat. No. 6,492,696 entitled "Semiconductor Device And Process Of Manufacturing The Same". Morimoto et al. describes use of a LOCOS process to form a recess of a controlled thickness. A LOCOS film is formed on the surface of exposed areas on the surface of a silicon layer of an SOI substrate. Then the LOCOS film is etched away, leaving a thinner channel region (a recessed channel region) where the LOCOS film has been etched away. Next, a metal film is formed on the entire surface of the substrate to form a silicide film. Since this method utilizes the SOI substrate by adjusting the thickness of the surface silicon layer, the depth of a source/drain region can be controlled, so a source/drain region of relatively large depth can be formed by a common step for forming the source/drain region. This LOCOS recessing process is problematic due to the control necessary in defining the silicon thickness below the gate electrode stack.

SUMMARY OF THE INVENTION

An object of this invention is to provide a method of forming a precision recessed gate structure using selective Reactive Ion Etching (RIE) of regions in the silicon.

In accordance with this invention, a method is provided for forming precision recessed structure such as a gate structure by the process of forming an amorphized region in a SOI silicon layer by ion implantation into the too surface of the SOI silicon layer. The following step is selective Reactive Ion Etching (RIE) of the amorphized region in the silicon to form the recess therein.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

The process flow of one embodiment of this invention, which is employed to form a recessed gate MOSFET is described below with reference to FIGS. 2A–2M. In accordance with the method of FIGS. 2A–2M, the structure of an MOSFET device 20 is defined in part by production of a precisely controlled gate recess 38 shown in FIG. 2C formed by the selective reactive ion etching of amorphized silicon formed by ion implantation.
Form Masking Layers Over Silicon-on-Insulator (SOI) Layer Starting in FIG. 2A, the MOSFET device 20 is shown in an early stage of manufacture. The substrate which has a planar upper surface comprises a BOX layer 22 formed on a wafer (not shown for convenience of illustration). Above the BOX layer 22, a conformal, planar, thin, p-doped, crystalline silicon layer 24 with top and bottom surfaces has been formed to serve as the doped region in which the source/drain and channel of an FET device is to be formed. As will be well understood by those skilled in the art, the silicon layer 24 is lightly p-type doped before the start of processing. After the BOX layer 22 is formed and after the isolation processing (which is not discussed herein but which will be well understood by those skilled in the art), the nFET regions get a p-well implant and the pFET regions get a n-well implant to form p- and -doped regions respectively, as will also be well understood by those skilled in the art.

Figure 1A:
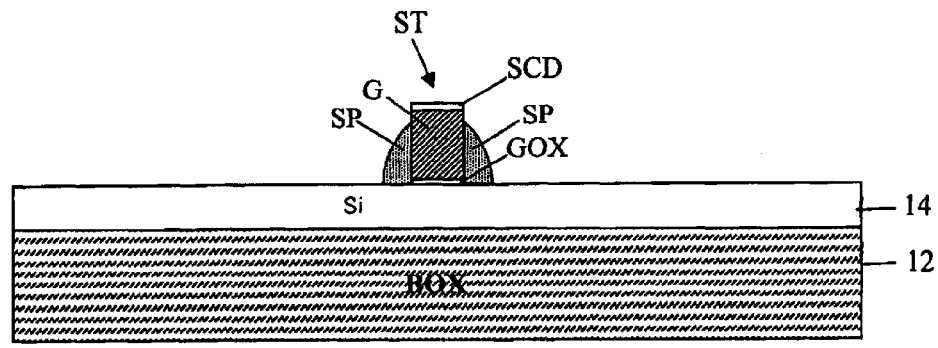
FIGS. 1A and 1B illustrates a possible approach to forming a raised source/drain structure, which is inadequate to produce the required results.
Figure 1B:
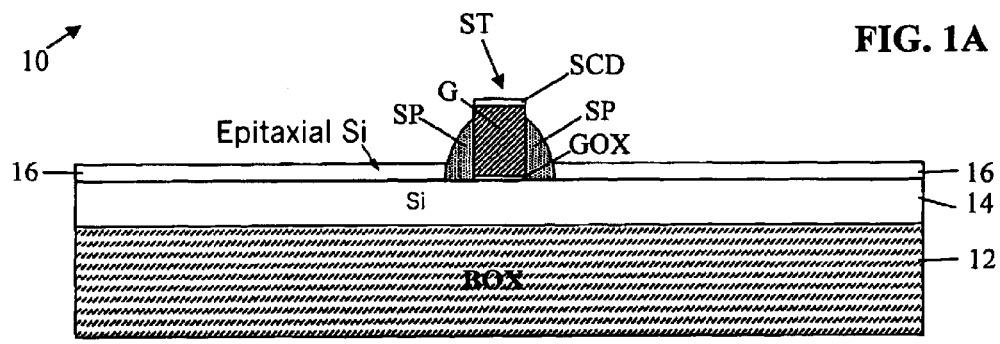
Figure 2A:
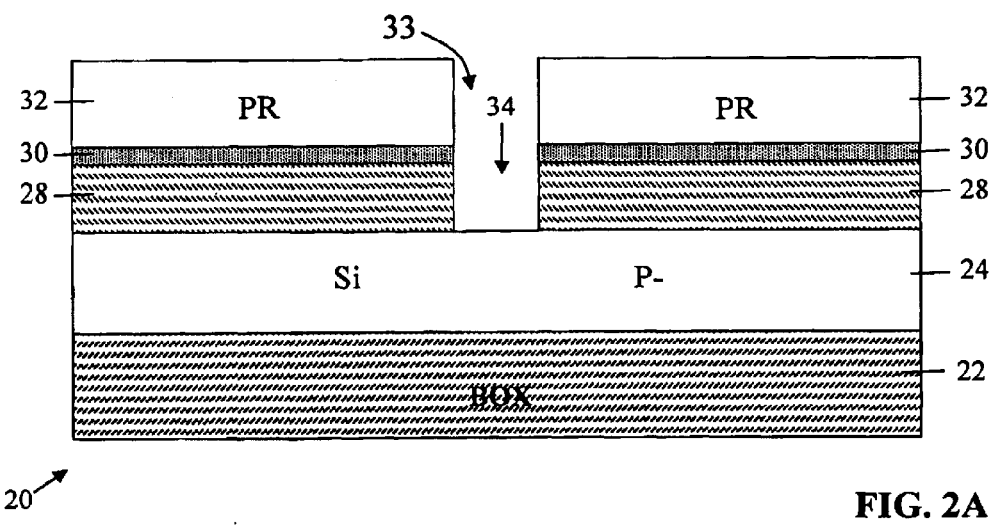
FIGS. 2A–2M illustrate the key steps of the process flow of one embodiment of this invention, which is employed to form a recessed gate MOSFET.
Figure 2B:
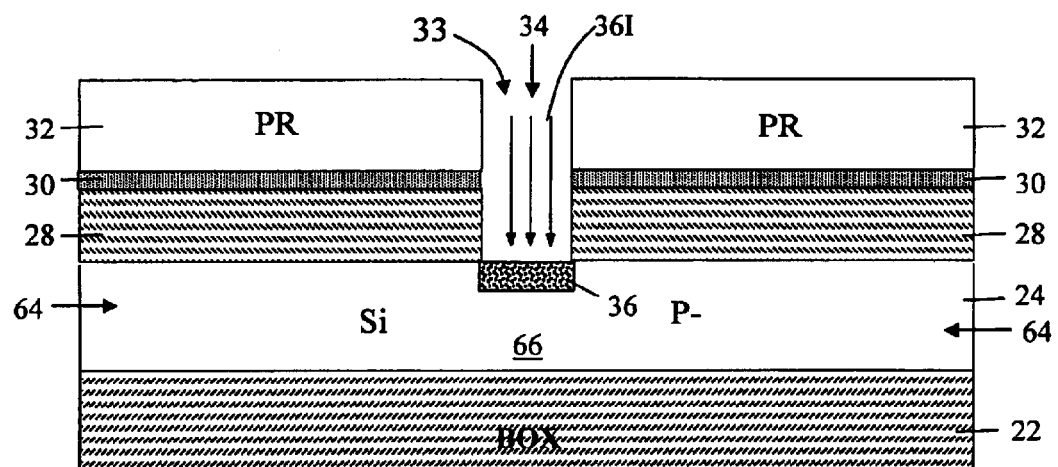

Above the thin doped, crystalline silicon layer 24, a conformal, planar, hard mask layer 28 which can be silicon oxide has been formed and coated with a silicon nitride layer 30 which is a thin layer that is also sacrificial. A photoresist (PR) mask 32 with a gate opening 33 therethrough has been formed over the silicon nitride (nitride) cap layer 30 above the center of the device 20. The mask 32 was formed by applying photoresist and exposing it using conventional photolithographic techniques. The photoresist mask 32 has been employed to etch a gate window 34 through the nitride layer 30 and the hard mask layer 28 down to the surface of the thin, doped, crystalline silicon layer 24.
Amorphize Exposed Area of Silicon-on-Insulator Layer In FIG. 2B, the device 20 of FIG. 2A is shown after ion implanting ions 36I through the window 34 into the surface of the thin doped, crystalline silicon layer 24 amorphizing a specific thickness of the exposed portion of the thin, doped crystalline silicon layer 24 reaching down from the top surface of crystalline silicon layer 24 to a shallow depth well above bottom surface of crystalline silicon layer 24 and well above the top surface of the BOX layer 22. The thickness of the amorphized silicon layer 36 in the surface of the crystalline silicon layer 24 can be precisely tailored by changing the ion energy, dose or ion species of the ions 36I during performance of the ion implantation process. The preferred ions 36I are silicon or germanium. The implant is masked using a material for the hard mask layer 28, such as silicon dioxide, silicon nitride or silicon oxynitride or a combination of these films which has been patterned using conventional lithography. If the structure to be built is a recessed channel MOSFET, the hard mask layer 28 and the can nitride layer 30 will also act as the mandrel on which temporary or disposable spacers are formed. The thickness of the amorphous layer is determined by the energy of the implantation procedure. For example, TABLE I shows the amorphous layer thickness for several energies of germanium ions implanted to a dose of $5.0 \times 10^{14}$ ions/cm2. As is shown by FIG. 2B, the thickness of the amorphized silicon layer 36 is a fraction of the thickness of the crystalline silicon layer 24, leaving the lower portion of the crystalline silicon layer 24 in its original condition as doped, crystalline silicon. Beneath the amorphized silicon layer 36 is a thinner region 66 of the crystalline silicon layer 24, whereas aside from the amorphized silicon layer 36 are thicker regions 64 of the crystalline silicon layer 24, since they have not been amorphized.

TABLE I

| Energy (Kev) | Thickness (nm) |
|---|---|
| 10 | 19.0 |
| 15 | 24.0 |
| 20 | 28.5 |
| 25 | 32.0 |
| 30 | 38.0 |
| 35 | 42.5 |
| 40 | 49.3 |

Strip Photoresist Mask

Figure 2C:
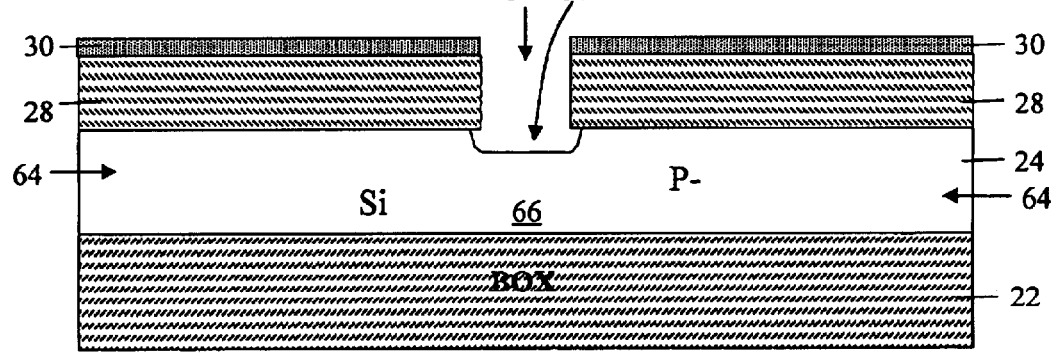
Figure 2D:
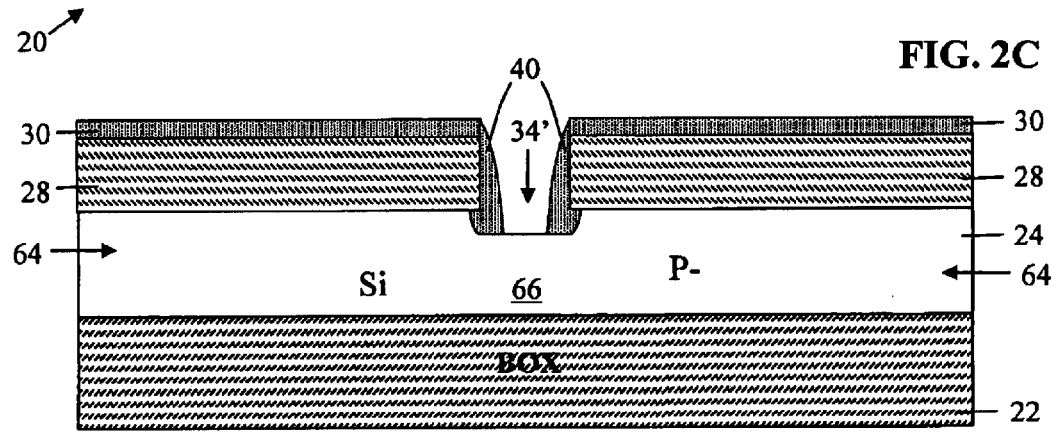

In FIG. 2C, the device 20 of FIG. 2B is shown after the preliminary steps of stripping away the photoresist mask 32 which removes the upper portion of the gate window 34, leaving a lower gate window 34' through the cap nitride layer 30 and the hard mask layer 28 down to the ton of the amorphized silicon layer 36.
Form Recess in Silicon-on-Insulator Layer with Selective Etch Referring again to FIG. 2C, the next step is a selective reactive ion etch (RIE) of the amorphized silicon layer 36 through the gate window 34' that has formed the recess 38. The conditions used for this etch must be such that the differential etch rate of the amorphous silicon is approximately three (3) times greater than that of thin, doped crystalline silicon layer 24. The differential etch rate provides a self-limiting etch which when combined with an interferometric endpoint system and the low etch rate allows the etch to precisely stop at the boundary between the implant damaged layer 36 and the thin crystalline silicon layer 24 therebelow and juxtaposed therewith laterally. The result is that gate window 34' has been expanded into a deeper gate window 34' that reaches down from the top surf of silicon layer 24 to the newly exposed surface of the thin doped silicon p-crystalline layer 24 at the bottom of the recess 38, newly exposed surface is well above the bottom surface of layer 24. A selective, low etch rate silicon etching process that can be used is based on using a mixture of hydrogen bromide (HBr) vapor with oxygen ($O_2$) gas in a diluent gas done in a decoupled plasma reactor, which is a dry etching process. The operation regime employs a pressure range of 20–60 mT (milli-Torr); hydrogen bromide (HBr) vapor HBr flow in the range of 150–300 sccm and oxygen ($O_2$) flow 4–10 sccm. Helium is used as the diluent gas. The key to success of this dry etching process is the use of low bias power. The interferometric endpoint system is used to stop the dry etching process, precisely, just after the desired silicon thickness has been etched.
Temporary Sidewall Spacer Formation FIG. 2D shows the device 20 of FIG. 2C after temporary (disposable) sidewall spacers 40 have been formed in the gate window 34' reaching from the bottom of the recess 38 on the exposed surface of silicon layer 24 up alongside the sidewalls of the gate window 34' in silicon layer 24, the mask layer 28 and the cap nitride layer 30. Silicon nitride, silicon dioxide, silicon oxynitrides or combinations of these films can be used to form the temporary sidewall spacers 40 by CVD, PECYD or other deposition techniques.

The following step is to etch back the temporary spacers 40 partially by directional Reactive Ion Etching (RIE) to produce the configuration shown in FIG. 2D leaving the bottom of the recess 38 open down to the surface of the silicon recess 38 in the center of the gate window 34'. The width of temporary sidewall spacers 40 after etching should be from 10 nm to 75 nm. As a result, spacers 40 taper outwardly from the bottom to the top, being wider at the bottom of the gate window 34' and narrowing down to a point near the top of the gate window 34'.

Gate Oxide Formation

Figure 2E:
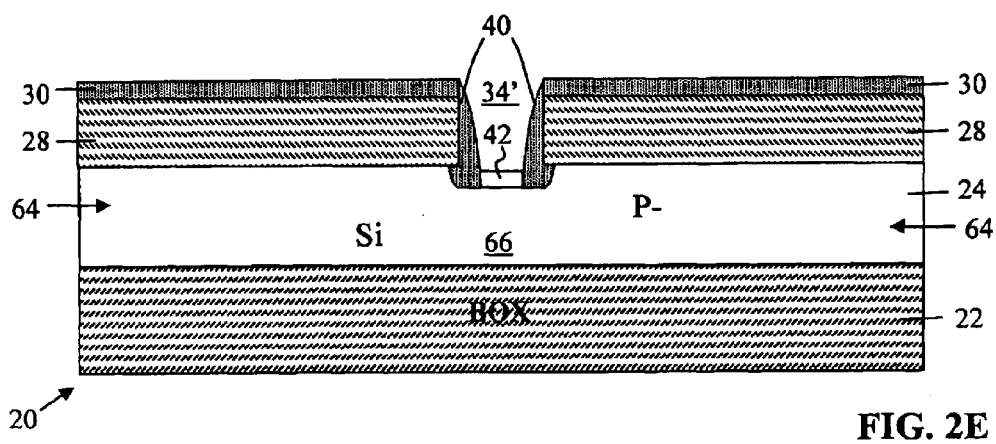

FIG. 2E shows the device 20 of FIG. 2D after formation of a gate oxide layer 42 on the surface of the silicon recess 38 in the center of the gate widow 34' at the bottom of the silicon recess 38, spaced far above the bottom surface of crystalline silicon layer 24. The gate oxide layer 42 can be a thermally grown silicon oxide or an oxynitride, with or without a pre-growth or post-growth nitridization treatment such as nitrogen ion implantation or plasma treatment. Post nitrogen treatment or post growth annealing can also be done. An alternative gate dielectric may be deposited such as a high permittivity (high-K) insulator by various techniques such as Atomic Layer Deposition (ALD) or CVD. Various pre-deposition and post-deposition treatments as described above for thermally grown silicon oxides can be applied to the high-K films also. Examples of high-K materials suitable for this application are $HfO_2$, $ZrO_2$, $Ta_2 O_2$, $SrTiO_3$ and $LaAlO_3$.

Formation of Gate Electrode

Figure 2F:
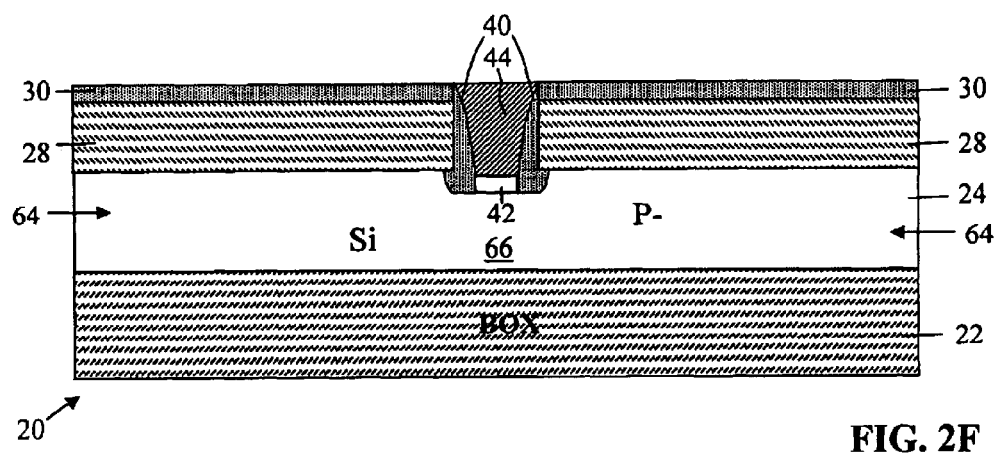

FIG. 2F shows the device 20 of FIG. 2E after formation of the gate electrode 44 by deposition of polysilicon into the gate window 34' covering the gate oxide layer 42 and filling the space defined by the temporary sidewall spacers 40. The gate electrode 44, which is shown in a cross sectional view, has an inverted trapezoidal shape with curved sidewall which is narrower at the bottom than the top, with the curved sidewalls conforming to the temporary sidewall spacers 40.

Planarization of Gate Polysilicon

FIG. 2F also shows the device after planarization of the top of the polysilicon, gate electrode 44 down to the level of the cap layer 30 by the well known process of Chemical-Mechanical Polishing (CMP).

Removal of the Mandrel Material

Figure 2G:
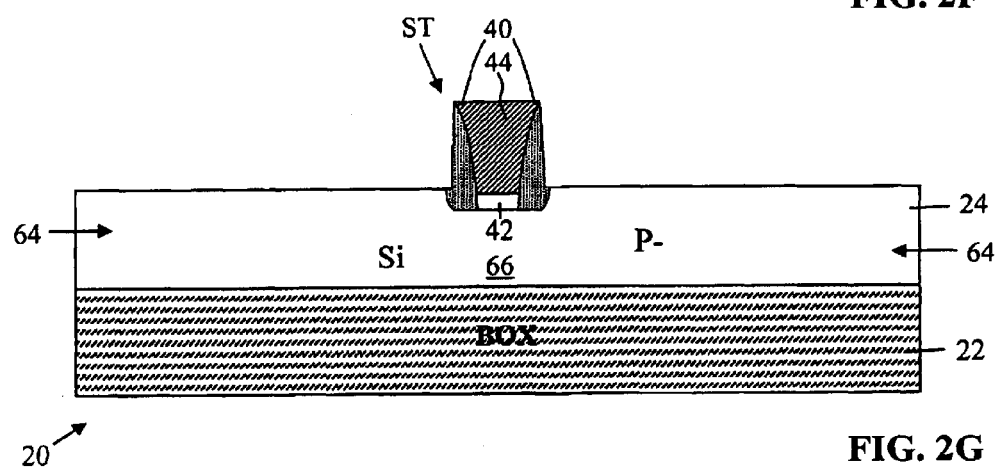

FIG. 2G shows the device 20 of FIG. 2F after removal of the mandrel material comprising the cap layer 30 and the hard mask 28 leaving the gate stack ST of the gate electrode 44 and the gate oxide 42 bordered by the temporary sidewall spacers 40 alone in the center of the doped, thin crystalline silicon layer 24. The cap layer 30 and the hard mask 28 were removed by a conventional selective etching process.

Removal of Spacers

Figure 2H:
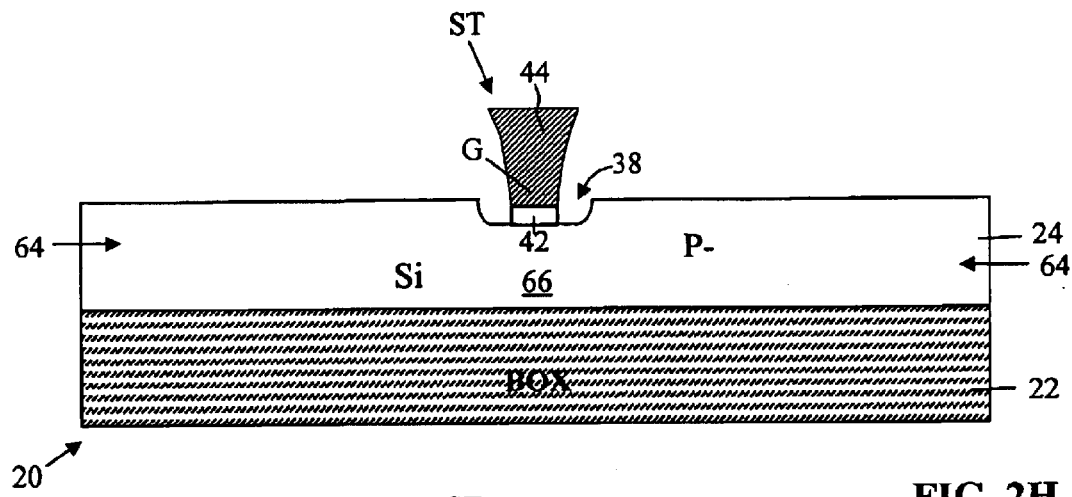

FIG. 2H shows the device 20 of FIG. 2G after removal of the temporary sidewall spacers 40 exposing the sidewalls of the gate stack ST (i.e. the sidewalls of the gate electrode 44 and the sidewalls of the gate oxide 42). Thus the gate stack ST has its base supported on the bottom surface of the recess 38. FIG. 2H shows that gate stack ST extends from the bottom surface of recess 38, where it is based, and above the ton surface of thin crystalline silicon layer 24. Moreover, the gate stack ST is located in the center of the recess 38 with a gap between the outer sidewalls of the recess 38 in the surface of the thin crystalline silicon layer 24 and the lateral walls of the gate oxide layer 42 and the lower outer edges of the gate electrode 44. Because the gate stack ST is based on the bottom of the recess 38, it is spaced far above the thin crystalline silicon layer 24 by the precise silicon thickness as described above with respect to FIG. 2C.

Gate Electrode Reoxidation

Figure 2I:
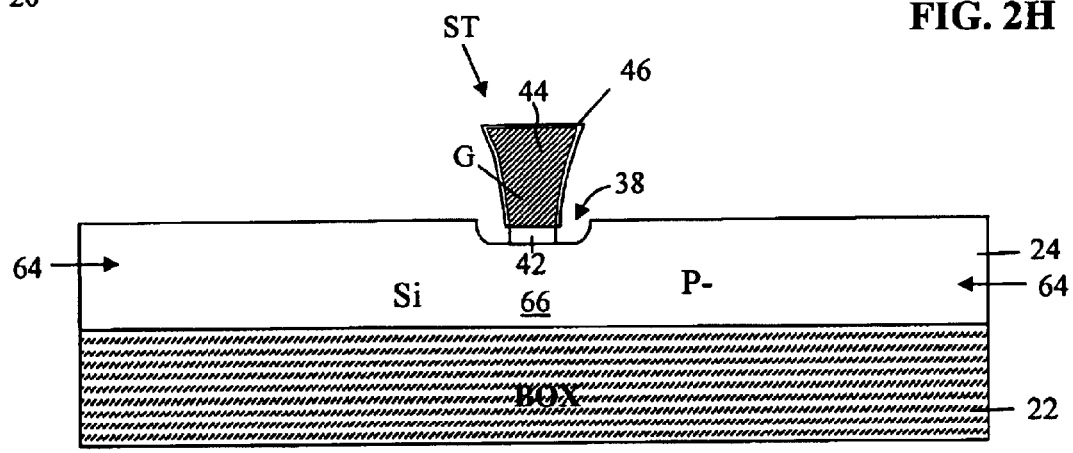

FIG. 2I shows the device 20 of FIG. 2H after growth of a thin thermal oxide layer 46 on the exposed top and sidewall surfaces of the gate electrode 44, which preferably has a thickness of from about 1 nm to about 5 nm.

Form nFET Extension/Halo Mask

Form a photolithographic mask to cover all areas except where the nFET devices are to be formed.

Implant nFET Extensions

Figure 2J:
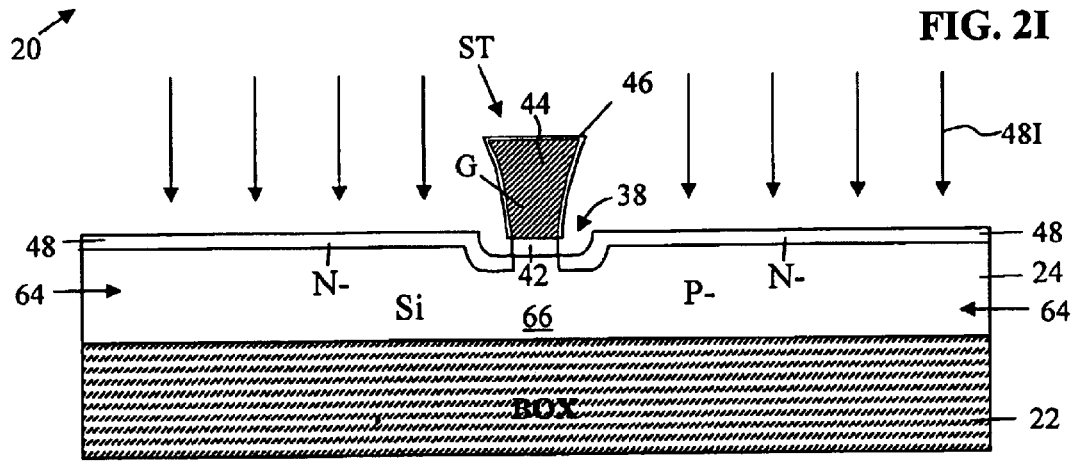

FIG. 2J shows the device 20 of FIG. 2I after a shallow nFET extension implant in the top surface of the thin crystalline silicon layer 24 with dopant 48I to form N– dopant regions 48 in the thin crystalline silicon layer 24 aside from that gate oxide layer 42 including the depressed regions of the recess 38 in the top surface of the thin crystalline silicon layer 24 including the top surface of recess 38, above the bottom surface of the thin crystalline silicon layer 24 and the top surface of the BOX layer 22.

TABLE II

| nFET | Extension Implant |
|---|---|
|  | Low energy |
| Dopant | Arsenic |
| Energy | 0.5 to 15 Kev |
| Dose | $2E14/cm^2$ to $2E15/cm^2$ |
| Angle | 0 to 10 degrees C. |

Perform nFET Halo Implant

Then an nFET halo implant is performed using either boron or $BF_2$ in accordance with the parameters of either TABLE IIIA or TABLE IIIB to form p-doped halo regions (not shown) as will be well understood by those skilled in the art.

TABLE IIIA

| nFET | Halo Implant |
|---|---|
| Dopant | Boron |
| Energy | 5 to 50 Kev |
| Dose | $2E13/cm^2$ to $2E14/cm^2$ |
| Angle | 0 to 45 degrees |

TABLE IIIB

| nFET | Halo Implant |
|---|---|
| Dopant | $BF_2$ |
| Energy | 10 to 70 Kev; |
| Dose | $2E13/cm^2$ to $2E14/cm^2$ |
| Angle | 0 to 45 degrees |

Strip nFET Photoresist Mask

Then the nFET extension/halo mask is stripped away to prepare for the pFET implant process Form pFET Extension/Halo Mask Form a photolithographic mask to cover all areas except where the pFET devices are to be formed. While these areas are not shown, since the features of the invention have been illustrated with respect to the nFET devices, the process is performed analogously as will be well understood by those skilled in the art.

Implant pFET Extensions

Perform a pFET extension implant with boron or $BF_2$ dopant in accordance with the parameters of either TABLE IVA or TABLE IVB below to form p-dopant regions (not shown) in the silicon layer 24 aside from the pFET gate oxide layer (not shown) of the pFET devices (not shown) including the depressed regions of the pFET recesses (not shown).

TABLE IVA

| pFET | Extension Implant |
|---|---|
| Dopant | Boron |
| Energy | 0.2 to 10 Kev |
| Dose | $2E14/cm^2$ to $2E15/cm^2$ |
| Angle | 0 to 10 degrees |

TABLE IVB

| pFET | Extension Implant |
|---|---|
| Dopant | $BF_2$ |
| Energy | 1 to 30 Kev |
| Dose | $2E14/cm^2$ to $2E15/cm^2$ |
| Angle | 0 to 10 degrees |

Perform pFET Halo Implant

Then an pFET halo implant is performed in accordance with the parameters of either TABLE V to form p-doped halo regions (not shown) as will be well understood by those skilled in the art.

TABLE V

| pFET | Halo Implant |
|---|---|
| Dopant | Arsenic |
| Energy | 20 to 100 Kev |
| Dose | $2E13/cm^2$ to $2E15/cm^2$ |
| Angle | 0 to 45 degrees |

Strip pFET Photoresist Mask

Then the pFET extension/halo mask is stripped away to prepare for Source/Drain formation process.

Form Source/Drain Spacers

Figure 2K:
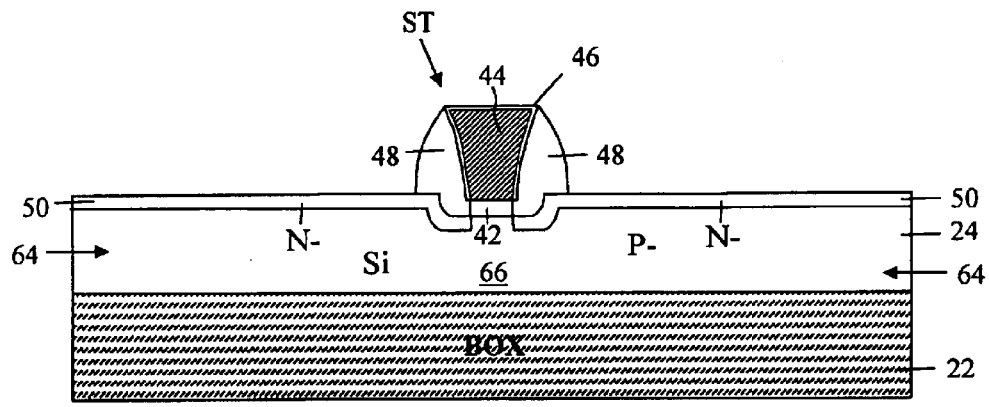

FIG. 2K shows the device 20 of FIG. 2J after formation of the source/drain sidewall spacers 48 aside from the gate electrode stack ST on the sidewalls thereof. The sidewall spacers 48 are formed of an FET spacer material such as silicon nitride, silicon dioxide, silicon oxynitrides or a combination of these films. The sidewall spacers 48 can be formed by CVD, PECVD or other deposition techniques followed by directional RIE. The spacer width of the sidewall spacers 48 after etching should be from about 15 nm to about 80 nm.

Form nFET Source/Drain Mask

Figure 2L:
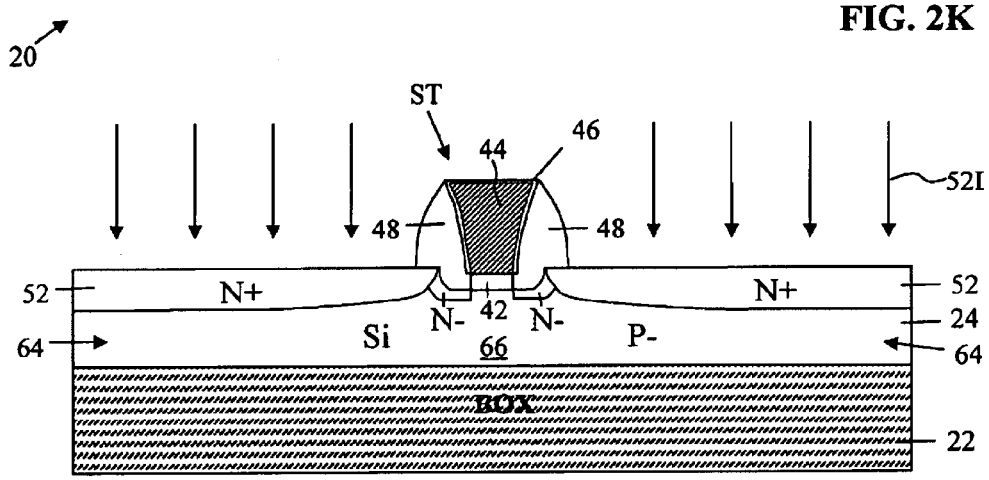

Form a photolithography to mask all areas except where the nFETs such as source/drain regions 52 in FIG. 2L are being formed.

Perform nFET Source/Drain Implant

FIG. 2L shows the device 20 of FIG. 2K during the next step of performing an nFET source/drain implant using the parameters in Table VIA or VIB below or a combination of the two forming the source/drain regions 52 in the top surface of the thin crystalline silicon layer 24 aside from the source/drain sidewall spacers 48 with the source/drain region 52 being located far above the bottom surface of the thin crystalline silicon layer 24 and the to surface of the BOX layer 22.

TABLE VIA

| nFET | Source/Drain Implant |
|---|---|
| Dopant | Arsenic |
| Energy | 5 to 50 Kev |
| Dose | $1E15/cm^2$ to $1E16/cm^2$ |
| Angle | 0 to 10 degrees |

TABLE VIB

| nFET | Source/Drain Implant |
|---|---|
| Dopant | Phosphorous |
| Energy | 2 to 20 Kev |
| Dose | $1E15/cm^2$ to $1E16/cm^2$ |
| Angle | 0 to 10 degrees |

Strip nFET Source/Drain Mask

Next the nFET source/drain mask is stripped.

Form pFET Source/Drain Mask

Form a photolithography to mask all areas except where the pFETs are being formed.

Perform pFET Source/Drain Implant

The next step is to perform a pFET source/drain implant using the parameters in Table VIIA or VIIB below.

TABLE VIIA

| pFET | Source/Drain Implant |
|---|---|
| Dopant | Boron |
| Energy | 3 to 15 Kev |
| Dose | $1E15/cm^2$ to $1E16/cm^2$ |
| Angle | 0 to 10 degrees |

TABLE VIIB

| pFET | Source/Drain Implant |
|---|---|
| Dopant | $BF_2$ |
| Energy | 10 to 50 Kev |
| Dose | $1E15/cm^2$ to $1E16/cm^2$ |
| Angle | 0 to 10 degrees |

Photoresist Strip

Next the nFET source/drain mask is stripped

Perform Source/Drain Anneal

TABLE VIIIA

| Source/Drain Anneal | Rapid Thermal Anneal (RTA) |
|---|---|
| Temperature | 800 to 1100 degrees C. |
| Time | 0 to 60 seconds |

TABLE VIIIB

| Source/Drain Anneal | Conventional Anneal |
|---|---|
| Temperature | 850 to 1000 degrees C. |
| Time | 2 to 30 minutes |

Silicide Formation

Figure 2M:
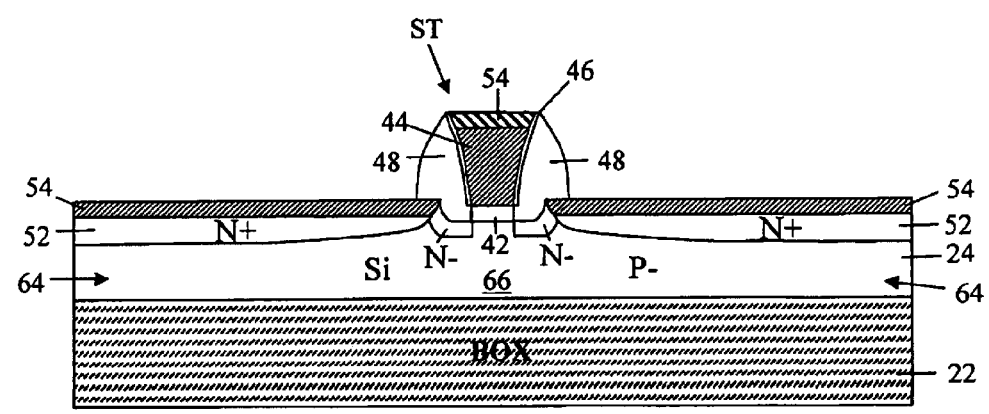

FIG. 2M shows the device 20 of FIG. 2L after formation of self-aligned silicide layer 54 on the source/drain 52 and polysilicon gate surfaces. Titanium, Cobalt, Nickel or other metals can be used to form the suicide.

The basic MOSFET transistors are now formed.

Any one of many contact and metallization schemes known to those skilled in the art of integrated circuit processing can now be used to produce the complete integrated circuit chip.

Precision Thinning of Selected Region of SOI Wafers

The process flow of a second embodiment of this invention, which is employed to perform thinning of selected regions of SOI wafers is described below with reference to FIGS. 3A–3C. In accordance with the method of FIGS. 3A–3C, the structure of a device 60, e.g. a semiconductor chip, is defined in part by production of a precisely controlled gate recess 38 shown in FIG. 3C formed by the selective reactive ion etching of amorphized silicon formed by ion implantation.

The precision thinning method described above can also be used to produce multiple thicknesses of silicon 24 on buried silicon oxide (BOX) layer 22, i.e. SOI wafers, so that various electronic devices on the same device 60 can built with the optimal thickness for each device. A process flow for this structure is described below with reference to FIGS. 3A–3C.

Amorphize Silicon Thickness in Selected Areas

Figure 3A:
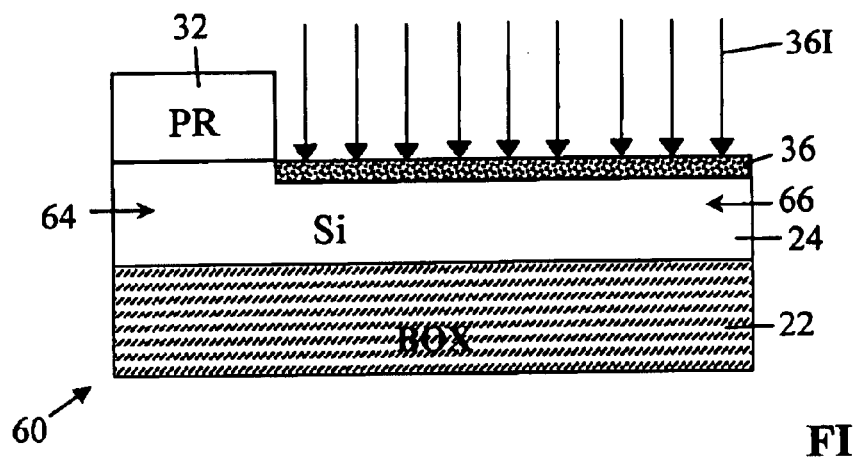
FIGS. 3A–3C illustrate the key steps of the process flow of another embodiment of this invention, which is employed to form a recessed surface in a silicon layer.

FIG. 3A shows an SOI device 60, which comprises a BOX layer 22 on which a thin crystalline silicon layer 24 has been formed. A photoresist mask 32 has been formed on the left side of the device 60 leaving surface of the silicon layer 24 on the right side exposed. The photoresist mask 32 is formed by applying photoresist and exposing it using conventional photolithographic techniques. In FIG. 3A, the exposed portion of the crystalline silicon layer 24 is shown being amorphized by the process of ion implantation of ions 36I as described above to form an amorphous silicon layer 36 in the ton surface of the right side of the SOI device 60, aside from the mask 32 leaving a thinner crystalline silicon layer 66 below the amorphous silicon layer 36. A thicker crystalline silicon layer 64 remains below the photoresist mask 32.

Figure 3B:
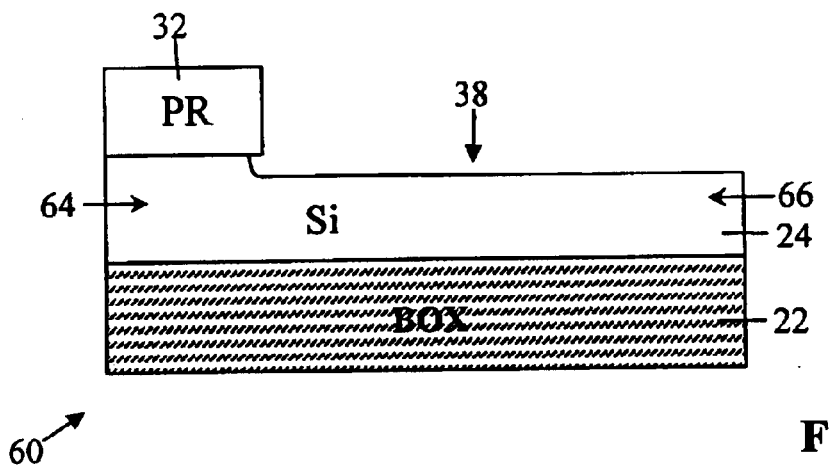

FIG. 3B shows the SOI device 60 of FIG. 3A after a selective Reactive Ion Etch (RIE) for removal of the amorphized layer 36 has been performed using the conditions described above to form a recess 38 with a controlled depth, as described above. The result of removal of the amorphized layer 36 is that the top surface of thinner crystalline silicon layer 66 is exposed where the recess 38 has been formed. An undercut of the recess 38 below a portion of the photoresist mask 32 is shown as will be well understood by those skilled in the art of the selective RIE process.

Figure 3C:
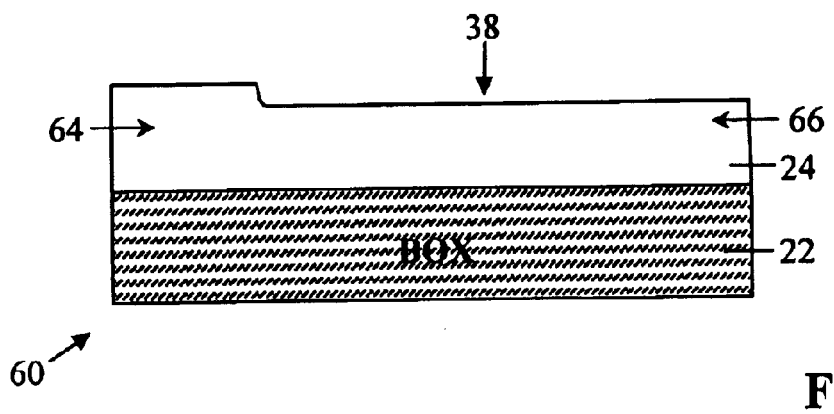

FIG. 3C shows the device of FIG. 3B after the photoresist mask 32 has been stripped away from above the thicker crystalline silicon layer 64 leaving the SOI device 60 with the thinner crystalline silicon layer 66 exposed below the recess 38 and the thicker crystalline silicon layer 64 exposed aside from the recess 38.

As stated above, with reference to FIGS. 3A–3C. use is made of conventional microelectronic processing methods to form various electronic devices in the regions of silicon thinned to the optimal thickness for each type of device. As state above, this invention provides a method for forming a structure with a precision recessed gate structure for an Ultra Thin (UT) silicon SOI device comprising a thin layer of doped silicon formed on the surface of a Buried OXide (BOX) layer. The method can also be used for precision thinning of selected regions of the top silicon layer on a Silicon-On-Insulator (SOI) wafer. This can be used to provide an optimal silicon thickness for each type of electronic device which is to be formed on the same wafer. For example, MOSFETS require thinner silicon than resistors or capacitors or diodes in order to achieve the best electrical characteristics. Also, as stated above, with reference to FIGS 3A–3C the precision thinning method described above can also be used to produce multiple thicknesses of silicon 24 on buried silicon oxide (BOX) layer 22, i.e. SOI wafers, so that various electronic devices on the same device 60 can built with the optimal thickness for each device.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A method for forming an electronic device based on a recess bottom formed in a crystalline silicon layer having a top surface and a bottom surface by precisely thinning of the crystalline silicon layer thereby forming a recess therein with a recess bottom and then forming the electronic device thereon by the steps as follows:

forming a patterning mask with a window therethrough over the top surface of the crystalline silicon layer, performing the step of forming an amorphized region in the top surface of the crystalline silicon layer below the window reaching from the top surface of the crystalline silicon layer to a distance spaced substantially above the bottom surface of the crystalline silicon layer, selectively etching away the amorphized region in the top surface of the crystalline silicon layer to form a recess in the top surface of the crystalline silicon layer with the recess bottom spaced above the bottom surface of the crystalline silicon layer and stopping the etching when the recess bottom is spaced by the precise distance above the bottom surface of the crystalline silicon layer, removing the patterning mask, and forming the electronic device on the recess bottom.

2. The method of claim 1 wherein the step of forming the amorphized region of the crystalline silicon layer is performed by ion implantation of ions.

3. The method of claim 2 wherein the amorphized region is removed by etching using a dry ion etch, which selectively etches amorphous silicon faster than crystalline silicon.

4. The method of claim 1 wherein the step of forming an amorphized region in the crystalline silicon layer is performed by ion implantation of ions selected from the group consisting of silicon and germanium.

5. The method of claim 4 wherein the amorphized region is removed by etching using a reactive ion etch (RIE) which selectively etches amorphous silicon faster than crystalline silicon.

6. The method of claim 1 wherein the amorphized region is removed by etching using a dry etch, which selectively etches amorphous silicon faster than crystalline silicon.

7. The method of claim 1 comprising:

the crystalline silicon layer being included in a Silicon-On-Insulator (SOI) device comprising a thin crystalline silicon layer formed over a buried silicon oxide layer, then, after removing the patterning mask, forming a gate electrode stack on the recess bottom in the top surface of the crystalline silicon layer, and then forming source/drain regions in the top surface of the crystalline silicon layer adjacent to the gate electrode stack spaced far above the bottom surface of the crystalline silicon layer.

8. The method of claim 1 including performing the step, after the recess is formed in the top surface of the crystalline silicon layer, of forming a recessed MOSFET gate electrode stack on the recess bottom with a channel region formed in the crystalline silicon layer therebelow with source/drain regions formed in the top surface of the crystalline silicon layer spaced far above the bottom surface of the silicon layer.

9. A method for forming a MOSFET device on a bottom of a recess in a crystalline silicon layer formed on a Buried Oxide (BOX) layer having a top surface and a bottom surface including precisely thinning the silicon layer to form a recess for a gate electrode with a recessed channel comprising:

forming a hard mask layer having an upper surface above the top surface of the crystalline silicon layer, forming a mask above the upper surface of the hard mask layer with an open window therethrough, forming an opening through the window through the hard mask layer down to the top surface of the crystalline silicon layer, performing the step of forming an amorphized region extending from the top surface of the crystalline silicon layer below the window to a depth with the bottom of the amorphized region spaced a substantial distance above the bottom surface of the crystalline silicon layer, selectively etching away the amorphized region of the crystalline silicon layer with a dry etching process to form a recess in the surface of the crystalline silicon layer with the bottom of the recess spaced by the precise distance above the bottom surface of the crystalline silicon layer, stripping away the hard mask, forming a MOSFET gate electrode stack on the bottom of the recess with channel region therebelow, and forming source/drain regions of an MOSFET gate juxtaposed with the gate electrode stack.

10. The method of claim 9 wherein the step of forming an amorphized region in the crystalline silicon layer is performed by ion implantation of ions selected from the group consisting of silicon and germanium.

11. The method of claim 10 wherein the amorphized region is removed by etching using a reactive ion etch (RIE) which selectively etches amorphous silicon faster than crystalline silicon.

12. The method of claim 9 wherein the amorphized region is removed by etching using a dry etch which selectively etches amorphous silicon faster than crystalline silicon.

13. The method of claim 9 wherein the amorphized region is removed by etching using a reactive ion etch (RIE) which selectively etches amorphous silicon faster than crystalline silicon using a mixture of hydrogen bromide (HBr) vapor with oxygen ($O_2$) gas in a diluent gas done in a decoupled plasma reactor.

14. The method of claim 9 wherein the amorphized region is removed by etching using a reactive ion etch (RIE) which selectively etches amorphous silicon faster than crystalline silicon using a mixture of hydrogen bromide (HBr) vapor with oxygen ($O_2$) gas in a diluent gas done in a decoupled plasma reactor, employing a pressure range of 20–60 mT (milli-Torr); hydrogen bromide (HBr) vapor HBr flow in the range of 150–300 sccm and oxygen ($O_2$) flow 4–10 sccm with helium is used as the diluent gas.

15. A method for forming a MOSFET device on a bottom surface of a recess in a top surface of a crystalline silicon layer formed above a Buried Oxide (BOX) layer, the crystalline silicon layer having both the top surface and a bottom surface with the recess having a recess bottom located a precise distance above the bottom surface, by the step including:

precisely thinning a region of the crystalline silicon layer to form a recess therein spaced far above the bottom surface of the crystalline silicon layer by the precise distance for providing a support for a gate electrode with a recessed channel by the steps comprising:

forming a hard mask over the top surface of the crystalline silicon layer, forming a patterning mask over the top surface of the hard mask layer with a window through the patterning mask and the hard mask down to the surface of the crystalline silicon layer, performing the step of forming an amorphized region having a bottom and a top, with the amorphized region extending from the top surface of the crystalline silicon layer to a desired depth below the window, with the bottom of the amorphized region being spaced above the bottom surface of the crystalline silicon layer and above the BOX layer with a thinner layer of crystalline silicon remaining between the amorphized region and the bottom surface of the crystalline silicon layer, selectively etching away the amorphized region of the crystalline silicon layer to form a recess having a recessed surface in the top surface of the crystalline silicon layer with a dry etch, employing an interferometric endpoint system to stop the etching process, precisely, just after the desired thickness of the amorphized region in the crystalline silicon layer has been etched to leave a thinner layer of crystalline silicon above the BOX layer, with the recessed surface of the recess being etched to the precise distance above the bottom surface of the crystalline silicon layer by employing endpoint detection to stop the etching process when the desired thickness of the amorphized region in the crystalline silicon layer has been etched, stripping away the patterning mask forming temporary sidewall spacers in the window and on the recessed surface of the recess, forming a MOSFET gate oxide layer on the recessed surface of the recess between the temporary sidewall spacers, forming a MOSFET gate electrode above the gate oxide layer with a channel region therebelow, stripping away the hard mask, stripping away the temporary sidewall spacers, performing a gate electrode reoxidation on exposed gate electrode surfaces, and forming source/drain regions in the top surface of the crystalline silicon layer with the source/drain regions being spaced above the BOX layer substrate of an MOSFET gate juxtaposed with the gate electrode.

16. The method of claim 15 wherein the step of forming an amorphized region in the crystalline silicon layer is performed by ion implantation of ions selected from the group consisting of silicon and germanium.

17. The method of claim 16 wherein the amorphized region is removed by etching using a reactive ion etch (RIE) which selectively etches amorphous silicon faster than crystalline silicon.

18. The method of claim 15 wherein the amorphized region is removed by etching using a dry etch which selectively etches amorphous silicon faster than crystalline silicon.

19. The method of claim 15 wherein the amorphized region is removed by etching using a reactive ion etch (RIE) which selectively etches amorphous silicon faster than crystalline silicon using a mixture of hydrogen bromide (HBr) vapor with oxygen ($O_2$) gas in a diluent gas done in a decoupled plasma reactor.

20. The method of claim 15 wherein the amorphized region is removed by etching using a reactive ion etch (RIE) which selectively etches amorphous silicon faster than crystalline silicon using a mixture of hydrogen bromide (HBr) vapor with oxygen ($O_2$) gas in a diluent gas done in a decoupled plasma reactor, employing a pressure range of 20–60 mT (milli-Torr); hydrogen bromide (HBr) vapor HBr flow in the range of 150–300 sccm and oxygen ($O_2$) flow 4–10 sccm with helium is used as the diluent gas.

* * * * *